(12) United States Patent
Lee et al.

(10) Patent No.: US 12,315,708 B2
(45) Date of Patent: May 27, 2025

(54) APPARATUS FOR TREATING SUBSTRATE

(71) Applicant: SEMES CO., LTD., Cheonan-si (KR)

(72) Inventors: Su Hyung Lee, Hwaseong-si (KR); Ju Yong Jang, Seongnam-si (KR); Hiroaki Hori, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 160 days.

(21) Appl. No.: 18/167,303

(22) Filed: Feb. 10, 2023

(65) Prior Publication Data

US 2024/0071733 A1    Feb. 29, 2024

(30) Foreign Application Priority Data

Aug. 23, 2022    (KR) .................... 10-2022-0105233

(51) Int. Cl.
*H01J 37/32*    (2006.01)
(52) U.S. Cl.
CPC .. *H01J 37/32724* (2013.01); *H01J 37/32642* (2013.01)
(58) Field of Classification Search
CPC .......... H01J 37/32724; H01J 37/32642; H01J 37/32715; H01J 37/32009; H01J 37/3244; H01J 37/32532; H01J 37/32495; H01L 21/67069; H01L 21/67017; H01L 21/68735; H01L 21/68785; H01L 21/6833; H01L 21/68757
See application file for complete search history.

(56) References Cited

U.S. PATENT DOCUMENTS

| 2012/0003451 A1* | 1/2012 | Weigel ................. B32B 27/322 |
| | | 428/212 |
| 2023/0207293 A1* | 6/2023 | Kim ................. H01J 37/32981 |
| | | 216/60 |

FOREIGN PATENT DOCUMENTS

| DE | 102016201565 A1 * | 6/2017 |
| JP | 3104893 U | 10/2004 |
| JP | 2014-165459 A | 9/2014 |
| KR | 10-2012-0123727 A | 11/2012 |
| KR | 10-2013-0110964 A | 10/2013 |

(Continued)

OTHER PUBLICATIONS

Korean Office Action dated Feb. 29, 2024 issued in corresponding Korean Appln. No. 10-2022-0105233.

*Primary Examiner* — Abdullah A Riyami
*Assistant Examiner* — Syed M Kaiser
(74) *Attorney, Agent, or Firm* — Harness, Dickey & Pierce, P.L.C.

(57) ABSTRACT

The inventive concept provides a substrate treating apparatus. The substrate treating apparatus includes a housing having a treating space for treating a substrate; a support unit positioned at the treating space; and a plasma source for generating a plasma by exciting a gas supplied to the treating space, and wherein the support unit includes: a first plate at which the substrate is positioned at a top side; a second plate which is positioned at a bottom side of the first plate; and an adhesive layer for adhering the first plate and the second plate to each other, and wherein a top surface of the second plate is divided into a central region including a center of the top surface and an edge region surrounding the central region, and a height of the adhesive layer filled between a bottom surface of the first plate and the top surface of the second plate is substantially different at the central region and at the edge region.

20 Claims, 10 Drawing Sheets

(56) References Cited

FOREIGN PATENT DOCUMENTS

| KR | 10-2014-0055247 A | 5/2014 | | |
|----|-------------------|--------|---|---|
| KR | 10-2016-0134921 A | 11/2016 | | |
| KR | 10-2017-0001603 A | 1/2017 | | |
| KR | 20170025964 A | * | 3/2017 | ......... H01L 21/6833 |
| KR | 20210044074 A | * | 4/2021 | ....... H01L 21/67103 |

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2022-0105233 filed on Aug. 23, 2022, in the Korean Intellectual Property Office, the entire contents of which are hereby incorporated by reference.

BACKGROUND

Embodiments of the inventive concept described herein relate to a substrate treating apparatus, more specifically, a substrate treating apparatus for plasma treating a substrate.

A plasma refers to an ionized gas state composed of ions, radicals, and electrons. The plasma is generated by very high temperatures, strong electric fields, or RF Electromagnetic Fields. The semiconductor element manufacturing process may include an etching process of removing a thin film formed on a substrate such as a wafer using the plasma. The etching process is performed by colliding ions and/or radicals of the plasma with or reacting with a thin film on the substrate.

FIG. 1 is a schematically illustrates a general substrate treating apparatus. FIG. 2 is an enlarged view of part D of FIG. 1.

Referring to FIG. 1, in general, the substrate S is supported and treated by the support unit 1000. For example, the substrate treating apparatus may treat the substrate S supported by the support unit 1000 by generating the plasma PA in the treating space 1001. Specifically, the plasma PA generated in the treating space 1001 may act on a film formed on the substrate S. The support unit 1000 supporting the substrate S may be formed of a plurality of plates. For example, a main plate 1100 for supporting the substrate S on a top surface thereof and a sub-plate 1200 disposed under the main plate 1100 may be included. In addition, an adhesive is filled between the main plate 1100 and the sub plate 1200 to form an adhesive layer 1300.

As shown in FIG. 2, in a process in which the substrate S is treated by the plasma PA, some of the plasma PA generated in the treating space 1001 acts on the adhesive layer 1300 exposed to the treating space 1001. The plasma PA acting on the adhesive layer 1300 causes a damage to the adhesive layer 1300. If the adhesive layer 1300 is damaged, an adhesive force between the main plate 1100 and the sub plate 1200 is weakened, and a horizontality of the substrate S seated on the main plate 1100 is broken. This results in a factor in which the plasma generated on a top side of the substrate S does not uniformly act on the substrate S. Also, if the adhesive layer 1300 is damaged, it causes a temperature imbalance within the support unit 1000 and causes various problems such as a weakening the characteristics of a withstand voltage. In addition, foreign substances BA such as particles generated in a process of damaging the adhesive layer 1300 float in the treating space 1001. The foreign substances BA floating in the treating space 1001 is attached to the substrate W again, causing process defects.

SUMMARY

Embodiments of the inventive concept provide a substrate treating apparatus for evenly treating a substrate.

Embodiments of the inventive concept provide a substrate treating apparatus for minimizing a damage of an adhesive layer which is filled between a support plate and a base plate by a plasma.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having a treating space for treating a substrate; a support unit positioned at the treating space; and a plasma source for generating a plasma by exciting a gas supplied to the treating space, and wherein the support unit comprises: a first plate at which the substrate is positioned at a top side; a second plate which is positioned at a bottom side of the first plate; and an adhesive layer for adhering the first plate and the second plate to each other, and wherein a top surface of the second plate is divided into a central region including a center of the top surface and an edge region surrounding the central region, and a height of the adhesive layer filled between a bottom surface of the first plate and the top surface of the second plate is substantially different at the central region and at the edge region.

In an embodiment, the top surface of the second plate is formed stepped so the edge region is higher than the central region.

In an embodiment, the edge region has a groove which is downwardly recessed from the top surface of the second plate.

In an embodiment, the first plate and the second plate each have a circular form when seen from above, and the groove is formed in a ring shape along a circumference of the edge region.

In an embodiment, the adhesive layer which is filled between the bottom surface of the first plate and the top surface of the second plate has a first height at the central region, and a second height which is lower than the first height at a region at which the groove is not formed among the edge region, and a region at which the groove is formed has a lower or same height as the first height and has a third height which is higher than the second height.

In an embodiment, a surface of the second plate is coated with a material having a stronger plasma resistance than the adhesive layer.

In an embodiment, an outer side of the adhesive layer is exposed to the treating space, and the outer surface of the adhesive layer is coated with a material having a stronger plasma resistance than the adhesive layer.

In an embodiment, the surface of the second plate and the outer surface of the adhesive layer are each coated with a material including an $Al_2O_3$.

In an embodiment, the surface of the second plate is coated using an atmospheric plasma spraying method.

In an embodiment, the outer surface of the adhesive layer is coated using an atomic layer deposition method or a chemical vapor deposition method.

In an embodiment, a diameter of a top portion of the second plate is smaller than a diameter of a bottom portion of the second plate.

In an embodiment, the substrate treating apparatus further includes: a gas supply unit configured to supply the gas; a shower plate positioned at a top side of the support unit and having a plurality of through-holes for flowing the gas supplied by the gas supply unit to the treating space; and an electrode plate positioned at the top side of the support unit and which is applied with a high frequency power or which is grounded, and wherein the support unit further comprises: a third plate positioned at a bottom side of the second plate; and a cover positioned at bottom side of the third plate and having a lift pin assembly therein for lifting and lowering the substrate positioned at a top side of the first plate.

The inventive concept provides a support unit. The support unit includes a support plate at which a substrate is placed at a top side thereon; a base plate positioned at a bottom side of the support plate; and an adhesive layer filled between the support plate and the base plate and which adheres the support plate and the base plate to each other, and wherein a top surface of the base plate is divided into a central region which includes a center of the top surface and an edge region which surrounds the central region, and a height of the adhesive layer is substantially different at the central region and at the edge region.

In an embodiment, a surface of the base plate is coated in a material having a stronger plasma resistance than the adhesive layer.

In an embodiment, an outer surface of the adhesive layer is coated with a material having a stronger plasma resistance than the adhesive layer.

In an embodiment, a height of the top surface of the base plate is higher at the edge region than at the central region.

In an embodiment, the support plate and the base plate have a circular form, and at least one groove is formed downwardly recessed from the top surface of the base plate at the top surface of the base plate, and the groove is formed in a ring shape along a circumference of the edge region.

In an embodiment, the adhesive layer has a first height at the central region, and a second height which is lower than the first height at a region at which the groove is not formed among the edge region, and a region at which the groove is formed has a lower or same height as the first height and has a third height which is higher than the second height.

The inventive concept provides a substrate treating apparatus. The substrate treating apparatus includes a housing having a treating space therein; a support unit positioned within the treating space and configured to support a substrate; a gas supply unit configured to supply a gas to the treating space; and an electrode plate positioned at a top side of the support unit at which a high frequency power is applied or which is grounded, and wherein the support unit comprises: a support plate formed in a circular shape and at which the substrate is positioned at a top side; a base plate formed in a circular shape and which is positioned at a bottom side of the support plate, and at which a high frequency power is applied or which is grounded; and an adhesive layer filled between the support plate and the base plate for adhering the support plate and the base plate, and wherein a top surface of the base plate is divided into a central region including a center of the top surface and an edge region surrounding the central region, and the top surface of the base plate is stepped so the edge region is higher than the central region, and a groove which is downwardly recessed from the top surface of the base plate is formed in a ring shape along a circumference of the edge region at the edge region.

In an embodiment, an outer surface of the adhesive layer and a surface of the base plate is coated in a material including an $Al_2O_3$ which has a stronger plasma resistance than the adhesive layer.

According to an embodiment of the inventive concept, a substrate may be evenly treated.

According to an embodiment of the inventive concept, a damage to an adhesive layer which is filled between a support plate and a base plate by a plasma may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
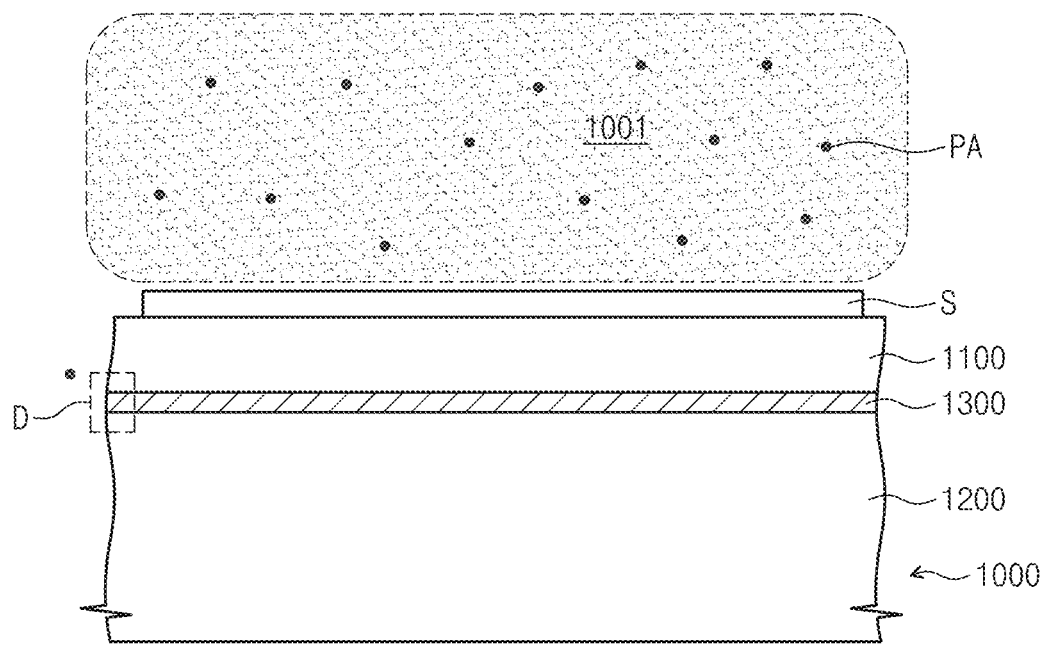
FIG. 1 is a schematically illustrates a general substrate treating apparatus.
Figure 2:
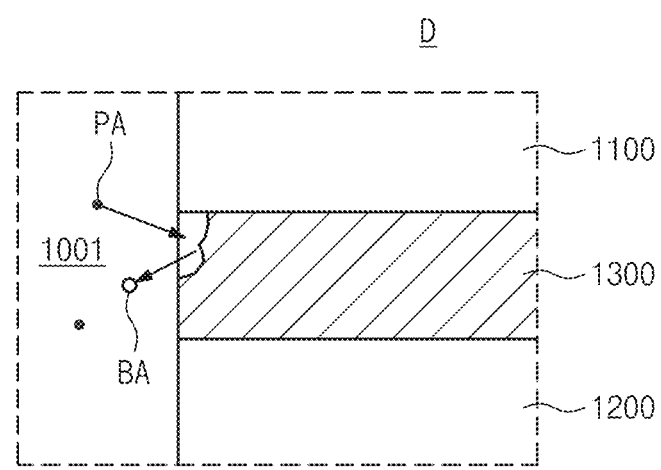
FIG. 2 is an enlarged view of part D of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

Figure 3:
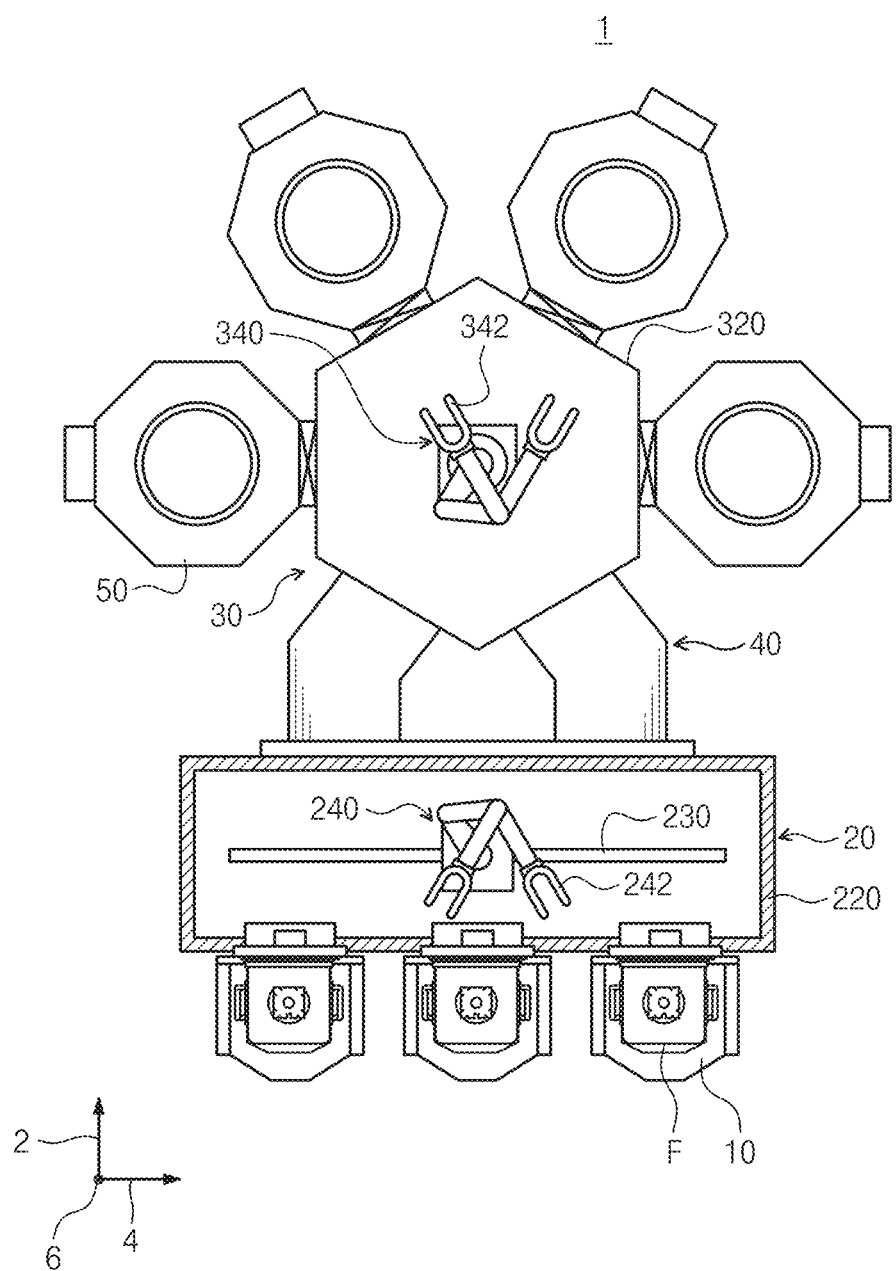
FIG. 3 is a schematically illustrates a substrate treating apparatus according to an embodiment of the inventive concept.

FIG. 3 is a schematically illustrates a substrate treating apparatus according to an embodiment of the inventive concept.

Referring to FIG. 3, the substrate treating apparatus 1 according to an embodiment of the inventive concept may include a load port 10, an atmospheric pressure transfer module 20, a vacuum transfer module 30, a load lock chamber 40, and a process chamber 50.

The load port 10 may be disposed on a side of the atmospheric pressure transfer module 20 to be described later. At least one load port 10 may be disposed on a side of the atmospheric pressure transfer module 20. The number of load ports 10 may increase or decrease according to a process efficiency and footprint conditions.

The container F may be placed in the load port 10. The container F may be loaded into the load port 10 or unloaded from the load port 10 by an operator or a means of transfer (not shown) such as an overhead transfer apparatus (OHT), an overhead conveyor, or an automatic guided vehicle. The container F may include various types of containers according to the type of goods to be stored. The container F may be a sealed container such as a front opening unified pod (FOUP).

The atmospheric pressure transfer module 20 and the vacuum transfer module 30 may be disposed along a first direction 2. Hereinafter, when viewed from above, a direction perpendicular to the first direction 2 is defined as a second direction 4. In addition, a direction perpendicular to a plane including both the first direction 2 and the second direction 4 is defined as a third direction 6. For example, the third direction 6 may be a direction perpendicular to the ground.

The atmospheric pressure transfer module 20 may transfer the substrate between the container F and the load lock chamber 40 to be described later. According to an embodiment, the atmospheric pressure transfer module 20 may take out the substrate from the container F and transfer the substrate to the load lock chamber 40, or may take out the substrate from the load lock chamber 40 and transfer the substrate to an inside of the container F.

The atmospheric pressure transfer module 20 may include a transfer frame 220 and a first transfer robot 240. The transfer frame 220 may be disposed between the load port 10 and the load lock chamber 40. The load port 10 may be connected to the transfer frame 220. According to an embodiment, an inside of the transfer frame 220 may maintain an atmospheric pressure atmosphere.

The transfer rail 230 is disposed on the transfer frame 220. A lengthwise direction of the transfer rail 230 may be horizontal to a lengthwise direction of the transfer frame 220. For example, the transfer rail 230 may have a lengthwise direction horizontal to the second direction 4. The first transfer robot 240 may be positioned on the transfer rail 230.

The first transfer robot 240 may transfer the substrate between the container F seated on the load port 10 and the load lock chamber 40 to be described later. The first transfer robot 240 may forwardly and backwardly move in the second direction 4 along the transfer rail 230. In addition, the first transfer robot 240 may be lifted and lowered in a vertical direction (e.g., a third direction 6).

The first transfer robot 240 has a first transfer hand 242. A substrate is placed on the first transfer hand 242. The first transfer hand 242 may forwardly, backwardly move and/or rotate on a horizontal plane. The first transfer robot 240 may have a plurality of first transfer hands 242. The plurality of first transfer hands 242 may be disposed to be spaced apart from each other in the vertical direction.

The vacuum transfer module 30 may be disposed between the load lock chamber 40 and the process chamber 50 to be described later. The vacuum transfer module 30 may include a transfer chamber 320 and a second transfer robot 340.

The inside of the transfer chamber 320 may be maintained in a vacuum pressure atmosphere. The second transfer robot 340 may be disposed in the transfer chamber 320. For example, the second transfer robot 340 may be disposed at a center of the transfer chamber 320. The second transfer robot 340 transfers the substrate between the load lock chamber 40 and the process chamber 50 to be described later. In addition, the second transfer robot 340 may transfer the substrate between the process chambers 50.

The second transfer robot 340 may be lifted and lowered in the vertical direction (e.g., the third direction 6). The second transfer robot 340 may have a second transfer hand 342 which forwardly, backwardly moves, and/or rotates on a horizontal plane. The substrate is placed on the second transfer hand 342. The second transfer robot 340 may have a plurality of second transfer hands 342. The plurality of second transfer hands 342 may be disposed to be spaced apart from each other in the vertical direction.

At least one process chamber 50 to be described later may be connected to the transfer chamber 320. According to an embodiment, the transfer chamber 320 may have a polygonal shape. The load lock chamber 40 and the process chamber 50 to be described later may be disposed at a circumference of the transfer chamber 320. For example, as illustrated in FIG. 1, a hexagonal transfer chamber 320 may be disposed in the center of the vacuum transfer module 30, and the load lock chamber 40 and the process chamber 50 may be disposed along its circumference. Unlike those mentioned above, a shape of the transfer chamber 320 and the number of process chambers 50 can be variously changed depending on user requirements or process requirements.

The load lock chamber 40 may be disposed between the transfer frame 220 and the transfer chamber 320. The load lock chamber 40 has a buffer space in which the substrate is exchanged between the transfer frame 220 and the transfer chamber 320. For example, the substrate on which a predetermined treatment is completed in the process chamber 50 may temporarily stay in the buffer space of the load lock chamber 40. In addition, the substrate taken out from the container F and scheduled for a predetermined treatment may temporarily stay in the buffer space of the load lock chamber 40.

As described above, the inside of the transfer frame 220 may be maintained in the atmospheric pressure atmosphere, and the inside of the transfer chamber 320 may be maintained in the vacuum pressure atmosphere. Accordingly, the load lock chamber 40 is disposed between the transfer frame 220 and the transfer chamber 320, so that the inner atmosphere thereof can be switched between the atmospheric pressure and the vacuum pressure.

The process chamber 50 is connected to the transfer chamber 320. A plurality of process chambers 50 may be provided. The process chamber 50 may be a chamber which performs a predetermined process on the substrate. According to an embodiment, the process chamber 50 may be a chamber for treating the substrate using a plasma.

For example, the process chamber 50 may be a chamber for performing an etching process for removing a thin film on the substrate using the plasma, an ashing process for removing a photoresist film, a strip process for removing a hard mask layer on the substrate, a deposition process for forming the thin film on the substrate, or a dry cleaning process. However, the inventive concept is not limited thereto, and a plasma treatment process performed in the process chamber 50 may be variously modified to a known process of treating the substrate using the plasma.

Figure 4:
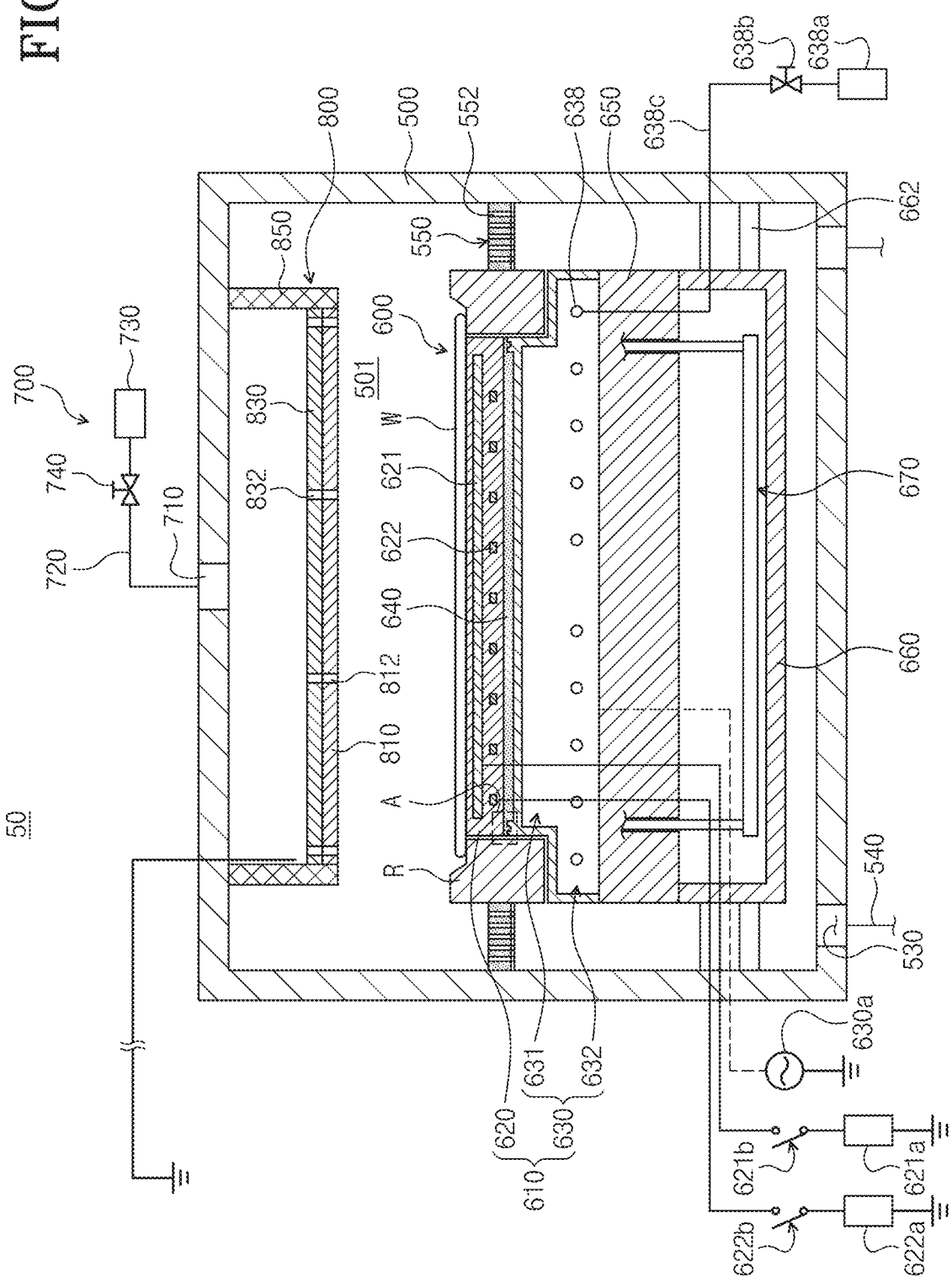
FIG. 4 is a cross-sectional view schematically illustrating a process chamber according to an embodiment.

FIG. 4 is a cross-sectional view schematically illustrating a process chamber according to an embodiment.

Referring to FIG. 4, in the process chamber 50 according to an embodiment, the substrate W may be treated using the plasma. The process chamber 50 may include a housing 500, a support unit 600, a gas supply unit 700, and a shower head unit 800.

The housing 500 has a shape in which an inside thereof is sealed. The housing 500 has an inner space. The inner space of the housing 500 functions as a treating space 501 for treating the substrate W. The treating space 501 may be substantially maintained in the vacuum-pressure atmosphere while treating the substrate W. The housing 500 may be grounded.

An inlet (not shown) is formed on a sidewall of the housing 500. The inlet (not shown) functions as a space in which the substrate W is taken into or taken out of the treating space 501. The inlet (not shown) may be selectively opened and closed by a door assembly which is not shown.

An exhaust hole 530 is formed on a bottom surface of the housing 500. The exhaust hole 530 is connected to an exhaust line 540. A depressurizing member (not shown) is installed in the exhaust line 540. The depressurizing member (not shown) may be any one of known pumps applying a negative pressure. A byproduct, including a gas supplied to the treating space 501 and particles, is filled to the outside of the treating space 501 through the exhaust hole 530 and the exhaust line 540. In addition, the depressurizing member (not shown) may change a pressure of the treating space 501 by adjusting a negative pressure value applied to the treating space 501.

An exhaust baffle 550 is disposed above the exhaust hole 530. The exhaust baffle 550 may be disposed between a sidewall of the housing 500 and a support unit 600 to be described later. The exhaust baffle 550 generally has a ring shape. At least one baffle hole 552 is formed in the exhaust baffle 550. The baffle hole 552 may penetrate a top surface and a bottom surface of the exhaust baffle 550. A gas and impurities in the treating space 501 pass through the baffle hole 552 and flow to the exhaust hole 530.

The support unit 600 is disposed in the treating space 501. The support unit 600 may be disposed to be spaced apart from the bottom surface of the housing 500 by a predetermined distance. The support unit 600 supports the substrate W. The support unit 600 may include an electrostatic chuck which adsorbs the substrate W using an electrostatic force. The inventive concept is not limited thereto, and the support unit 600 may support the substrate W in various ways such as ab vacuum adsorption or a mechanical clamping. Hereinafter, for convenience of understanding, a case in which the support unit 600 according to an embodiment includes an electrostatic chuck will be described as an example.

The support unit 600 may include an electrostatic chuck 610, an insulating plate 650, and a bottom cover 660. In addition, the electrostatic chuck 610 may include a support plate 620 and a base plate 630.

The support plate 620 according to an embodiment may be referred to as a first plate. The support plate 620 is positioned at a top portion of the support unit 600. According to an embodiment, the support plate 620 may be a disk-shaped dielectric. According to an embodiment, the support plate 620 may be made of a material including a ceramic.

The substrate W is seated on the top surface of the support plate 620. Accordingly, the substrate W is positioned above the support plate 620. The top surface of the support plate 620 may have a radius smaller than that of the substrate W. If the substrate W is seated on the top surface of the support plate 620, an edge region of the substrate W may be positioned outside the support plate 620.

An electrode 621 and a heater 622 may be disposed inside the support plate 620. According to an embodiment, the electrode 621 may be positioned above the heater 622 inside the support plate 620.

The electrode 621 is electrically connected to the first power source 621a. According to an embodiment, the first power source 621a may be a DC power source DC. A first switch 621b is installed between the electrode 621 and the first power source 621a. If the first switch 621b is turned on, the electrode 621 is electrically connected to the first power source 621a. An electrostatic force is applied between the electrode 621 and the substrate W by a current flowing through the electrode 621. Accordingly, the substrate W is adsorbed and supported by the support plate 620.

The heater 622 is electrically connected to the second power source 622a. A second switch 622b is installed between the heater 622 and the second power source 622a. If the second switch 622b is turned on, the heater 622 is electrically connected to the second power source 622a. The heater 622 may generate a heat by resisting the current supplied from the second power source 622a. The heat generated by the heater 622 is transferred to the substrate W through the support plate 620. The substrate W placed on the support plate 620 may be heated to a predetermined temperature by the heat generated by the heater 622. In the above-described example, the heater 622 is disposed in the support plate 620 as an example, but the inventive concept is not limited thereto. For example, the heater 622 may not be disposed inside the support plate 620.

Figure 5:
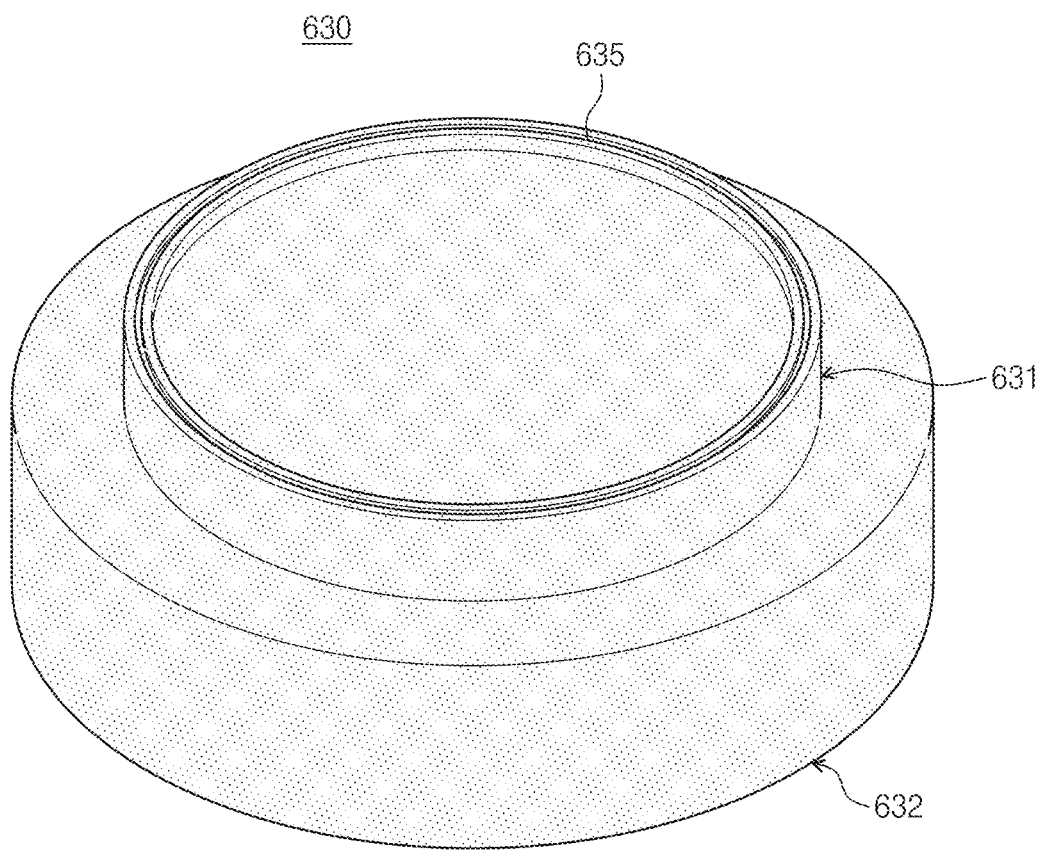
FIG. 5 is a perspective view schematically illustrating a base plate according to an embodiment of FIG. 4.
Figure 6:
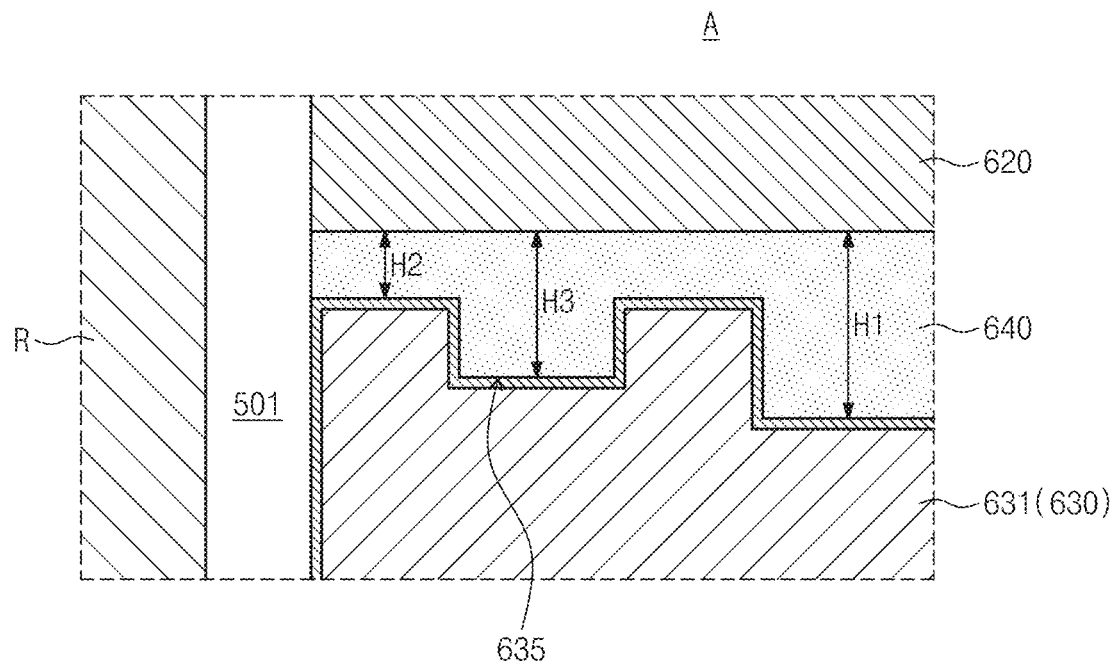
FIG. 6 is an enlarged cross-sectional view of part A of FIG. 4.

FIG. 5 is a perspective view schematically illustrating a base plate according to an embodiment of FIG. 4. FIG. 6 is an enlarged view of part A of FIG. 4. Hereinafter, a base plate and an adhesive layer according to an embodiment of the inventive concept will be described with reference to FIG. 4 to FIG. 6.

The base plate 630 according to an embodiment may be referred to as a second plate. The base plate 630 is disposed below the support plate 620. The base plate 630 may have a circular shape when viewed from above.

According to an embodiment, the base plate 630 may be formed to be stepped such that a top portion 631 and a bottom portion 632 have different diameters from each other. For example, the top portion 631 may have a smaller diameter than the bottom portion 632. In addition, a diameter of the top portion 631 may be the same as a diameter of the support plate 620 described above. The top portion 631 and the bottom portion 632 are made of the same material and may be integrally formed. According to an embodiment, the base plate 630 may be made of a material including a metal. In addition, the base plate 630 may be made of a conductive material. For example, the base plate 630 may be made of an aluminum.

The ring member R may be disposed at a stepped portion of the base plate 630. Specifically, the ring member R may be disposed on a top surface of the bottom portion 632. In addition, the ring member R may be disposed along a circumference of the top portion 631. In addition, the ring member R may be disposed to be spaced apart from a side surface of the top portion 631 by a predetermined distance. According to an embodiment, the ring member R may be a focus ring. Accordingly, an inner side surface of the ring member R and the side surface of the top portion 631 are exposed to the treating space 501.

The top surface of the ring member R may be formed to be stepped. According to an embodiment, a top surface of an inner portion of the ring member R may be positioned at the same height as the top surface of the support plate 620. In addition, the top surface of the inner portion of the ring member R may support a bottom surface of an edge region of the substrate W positioned outside the support plate 620. A top surface of an outer portion of the ring member R may surround a side surface of the edge region of the substrate W.

Hereinafter, for convenience of understanding, a top surface of the base plate 630 is divided into a central region and an edge region. Specifically, the top surface of the base plate 630 may be divided into a central region including a center of the top surface of the base plate 630 and an edge region surrounding the central region.

Here, the top surface of the base plate 630 means a top surface of the top portion 631 among the top portion 631 of the base plate 630 and the bottom portion 632 of the base plate 630. Hereinafter, when referred to as the top surface of the base plate 630 without additional mention, it refers to the top surface of the top portion 631. In addition, if it is referred to as the central region of the base plate 630 without any additional mention below, it refers to the top surface of the central region among the top surface of the top portion 631. In addition, if it is referred to as the edge region of the base plate 630 without any additional mention below, it refers to the top surface of the edge region among the top surface of the top portion 631.

According to an embodiment, the top surface of the base plate 630 may have different heights for each region thereof. For example, the top surface of the base plate 630 may be formed to be stepped so that the edge region thereof is higher than the central region. Specifically, the edge region of the base plate 630 may be positioned higher from the ground than the central region of the base plate 630.

According to an embodiment, a groove 635 may be formed on the top surface of the base plate 630. At least one groove 635 may be formed on the top surface of the base plate 630. The groove 635 may be downwardly recessed from the top surface of the base plate 630.

The groove 635 may be formed in the edge region of the base plate 630. The groove 635 is formed along a circumferential direction of the base plate 630. For example, the groove 635 may be formed in a ring shape along the circumferential direction of an edge region of the base plate 630. In addition, if multiple grooves 635 are formed on the top surface of the base plate 630, the grooves 635 may have a concentricity but different diameters.

An adhesive layer 640 may be formed by filling an adhesive between the bottom surface of the support plate 620 and the top surface of the base plate 630 according to an embodiment. The adhesive layer 640 may adhere the support plate 620 and the base plate 630 to each other. The adhesive layer 640 according to an embodiment may include a polymer adhesive.

Due to the above-described top surface structure of the base plate 630, a height of the adhesive layer 640 filled between the bottom surface of the support plate 620 and the top surface of the base plate 630 may vary from region to region of the base plate 630. For example, the height of the filled adhesive layer 640 may be different in the central region and the edge region of the base plate 630.

According to an embodiment, the adhesive layer 640 filled in the central region of the base plate 630 may have a first height H1. In addition, the adhesive layer 640 filled in the edge region of the base plate 630 may have a height lower than the first height H1. As described above, since the edge region of the base plate 630 is stepped to be higher than the center region of the base plate 630, it is obvious that the height of the adhesive layer 640 filled in the edge region of the base plate 630 is lower than the first height H1 of the adhesive layer filled in the edge region of the base plate 630.

Specifically, the adhesive layer 640 filled in a region of the edge region of the base plate 630 in which the groove 635 is not formed may have a second height H2. The second height H2 may be relatively lower than the first height H1. In addition, the adhesive layer 640 filled in a region at which the groove 635 is formed among the edge region of the base plate 630 may have a third height H3. The third height H3 may be lower than the first height H1 and higher than the second height H2. However, the inventive concept is not limited thereto, and the third height H3 may be the same as the first height H1 and may have a height higher than the second height H2.

In addition, the surface of the base plate 630 is coated with a material having a stronger corrosion resistance than the adhesive layer 640. More specifically, the surface of the base plate 630 is coated with a material having a stronger plasma resistance than the adhesive layer 640. In addition, the surface of the base plate 630 may be coated with a material having an excellent thermal conductivity. According to an embodiment, the surface of the base plate 630 may be coated with a material containing an $Al_2O_3$. Specifically, both the surface of the top portion 631 and the surface of the bottom portion 632 of the base plate 630 may be coated with a material containing an $Al_2O_3$. However, the bottom surface of the bottom portion 632 of the base plate 630 among surfaces of the base plate 630 may not be coated with a material containing an $Al_2O_3$.

In accordance with an exemplary embodiment, the surface of the base plate 630 can be coated using an atmospheric plasma spraying method. Specifically, after the groove 635 is formed in the edge region of the base plate 630, the surface of the base plate 630 is coated with an $Al_2O_3$ using an atmospheric plasma spraying method.

If the groove 635 is formed in the edge region of the base plate 630, the top end of the groove 635 may be designed to be higher than a top end of the base plate 630 by about 50 micrometers. In addition, the top end of the groove 635 and the top end of the base plate 630 may be designed to have a tolerance of approximately 10%. Subsequently, an adhesive is filled between the support plate 620 and the base plate 630. Accordingly, an adhesive layer 640 is formed between the bottom surface of the support plate 620 and the top surface of the base plate 630.

Accordingly, the height of the adhesive layer 640 filled between the support plate 620 and the base plate 630 may be substantially different from each other in the central region and the edge region of the base plate 630. That is, a height difference between the first height H1 and the second height H2 may be 50 micrometers or more. As described above, a height of the adhesive layer 640 filled between the top surface of the edge region of the base plate 630 and the bottom surface of the support plate 620 may be 50 micrometers higher than a height of the adhesive layer 640 filled between the top surface of the center region of the base plate 630 and the bottom surface of the support plate 620.

Figure 7:
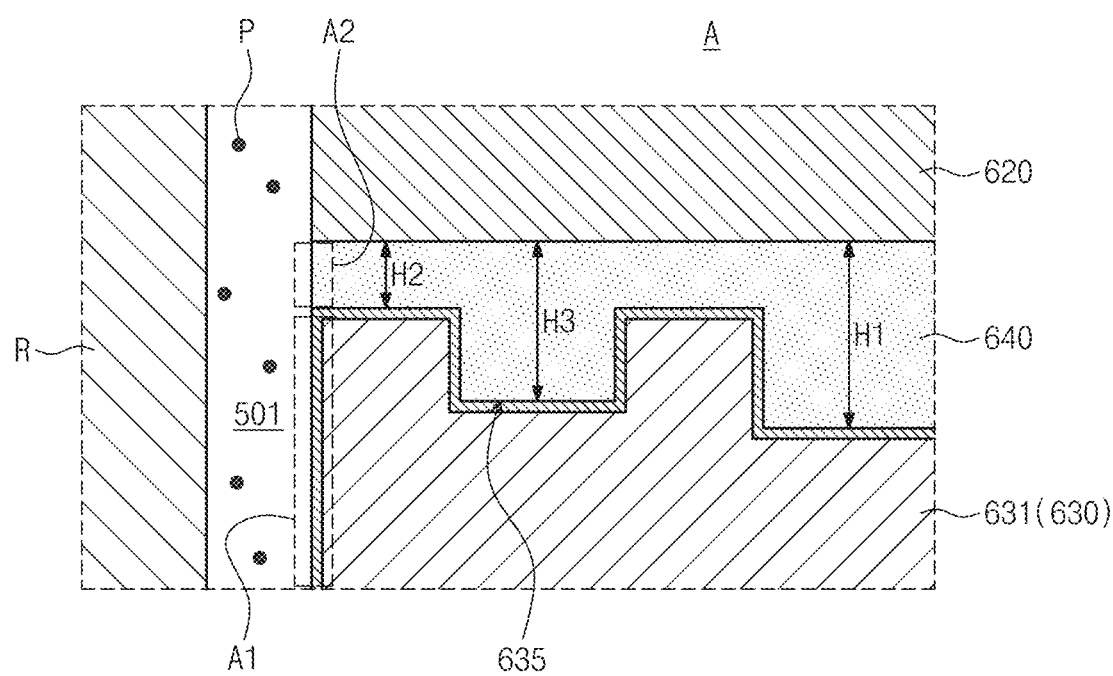
FIG. 7 is a view schematically illustrating a flow of a plasma in part A of FIG. 4.

FIG. 7 is a view schematically illustrating a flow of a plasma in part A of FIG. 4.

A plasma P generated in the treating space 501 may be introduced into a space spaced apart between the ring member R and the base plate 630.

As described above, a side surface of the base plate 630 (see A1 in FIG. 7) among the surface of the base plate 630 is exposed to the treating space 501. That is, the plasma P introduced into the space may act on a side surface of the base plate 630. For example, since the base plate 630 is made of an aluminum, if the base plate 630 is exposed to the treating space 501, the base plate 630 may be etched and damaged by the plasma P generated in the treating space 501. In addition, impurities, etc., which are one of the results of damage to the base plate 630 may be introduced into the treating space 501 and attached to the substrate W being treated in the treating space 501.

Accordingly, according to an embodiment of the inventive concept, a surface which may be exposed to the treating space 501 among the surface of the base plate 630 is coated with a material with a strong plasma resistance, thereby preventing a cause of damage to the base plate 630 by the plasma P generated in the treating space 501.

In addition, the outer surface of the adhesive layer 640 (see part A2 of FIG. 7) is directly exposed to the treating space 501, as described above. That is, a plasma P introduced into the space may act on an outer surface of the adhesive layer 640. Since the adhesive layer 640 is made of a material including a polymer, an etching resistance to the plasma P is relatively weak. In order to prevent a damage due to the plasma P due to a direct exposure of the adhesive layer 640 to the treating space 501, an adhesive force between the support plate 620 and the base plate 630 may be weakened if a minimizing a region of the adhesive layer 640 exposed to the treating space 501 is considered. Specifically, in the above case, the adhesive force between the support plate 620 and edge region of the base plate 630 is very weak.

Accordingly, due to a structure of the groove 635 according to an embodiment, the adhesive force due to a decrease in a thickness of the adhesive layer in the edge region of the support plate 620 and the base plate 630 can be supplemented, and an area of the adhesive layer 640 exposed to the treating space 501 can be minimized to prevent a damage to the adhesive layer 640 caused by the plasma P. More specifically, a height of the adhesive layer 640 in a region at which the groove 635 is formed among the edge area of the base plate 630 is greater than a height of the adhesive layer 640 in a region other than a region at which the groove 635 is formed among the edge area of the base plate 630. Therefore the adhesive force by the adhesive layer 640 may be further strengthened in the region at which the groove 635 is formed, and the adhesive layer 640 may be exposed to the treating space 501 in a smaller area in a region other than the region at which the groove 635 is formed.

In the above-described example, the top portion 631 and the bottom portion 632 of the base plate 630 have different diameters and are formed to be stepped, but the inventive concept is not limited thereto. For example, the top and bottom portions of the base plate 630 may be formed to have the same diameter.

Referring back to FIG. 4, the base plate 630 may be electrically connected to the bottom power source 630a. The bottom power source 630a may be a high frequency power source generating a high frequency power. For example, the high frequency power source may be an RF power source. The RF power source may be a high bias power RF power source. The base plate 630 receives the high frequency power from the bottom power source 630a. Accordingly, the base plate 630 may function as an electrode generating an electric field. According to an embodiment, the base plate 630 may function as a bottom electrode of a plasma source to be described later. However, the inventive concept is not limited thereto, and the base plate 630 may be grounded to function as a bottom electrode.

A circulation fluid channel 638 through which a cooling fluid circulates may be positioned inside the base plate 630. According to an embodiment, the circulation fluid channel 638 may have a spiral shape. Selectively, the circulation fluid channel 638 may be disposed such that ring-shaped fluid channels having different radii share the same center with each other. The circulation fluid channel 638 is connected to a supply source 638a through the supply line 638c.

The cooling fluid is stored in the supply source 638a. For example, the cooling fluid may be a coolant. A cooler (not shown) may be disposed in the supply source 638a. However, the inventive concept is not limited thereto, and the cooler (not shown) may be disposed on the supply line 638c. The cooler (not shown) may cool the cooling fluid to a predetermined temperature.

A supply valve 638b is installed in the supply line 638c. The supply valve 638b may be an opening/closing valve. The cooling fluid may be selectively supplied to the circulation fluid channel 638 according to the opening and closing of the supply valve 638b. The cooling fluid supplied to the circulation fluid channel 638 may adjust a temperature of the base plate 630 while flowing inside the circulation fluid channel 638. As the temperature of the base plate 630 is adjusted, a temperature of the substrate W may also be adjusted.

A fluid channel which is not illustrated for controlling the temperature of the substrate W by supplying a heat transfer medium to the bottom surface of the substrate W seated on the top surface of the support plate 620 may be further positioned inside the base plate 630.

An insulating plate 650 is positioned below the base plate 630. The insulating plate 650 according to an embodiment may be referred to as a third plate. The insulating plate 650 may include an insulating material. The insulating plate 650 electrically insulates the base plate 630 from a cover 660 to be described later. The insulating plate 650 may have a substantially circular shape when viewed from above. For example, the insulating plate 650 may have a disk shape. The insulating plate 650 may have an area corresponding to that of the base plate 630.

The cover 660 is positioned below the insulating plate 650. The cover 660 may have a cylindrical shape with an open top surface. The open top surface of the cover 660 may be covered by the insulating plate 650. A lift pin assembly 670 for lifting and lowering the substrate W may be disposed in the inner space of the cover 660. The lift pin assembly 670 may consist of a pin in contact with the substrate W seated on the top surface of the support plate 620 and a plate supporting the pin. Although not shown, a pin hole for lifting and lowering the lift pin of the lift pin assembly 670 is formed inside the support plate 620 and the base plate 630.

A plurality of connection members 662 are connected to an outer surface of the cover 660. More specifically, the connection member 662 connects the outer surface of the cover 660 to the sidewall of the housing 500. The plurality of connection members 662 may be disposed to be spaced apart along a circumferential direction of the cover 660. The connection member 662 supports the support unit 600 inside the housing 500. Accordingly, the support unit 600 may be disposed to be spaced apart from the bottom wall of the housing 500 by a predetermined distance. In addition, the connection member 662 may be connected to the grounded housing 500 to ground the cover 660. The connection member 662 may be formed in a hollow shape having a space therein. A power line connected to the first power source 621a, a power line connected to the second power source 622a, a power line connected to the bottom power source 630a, and a supply line 638c connected to the circulation fluid channel 638 extend to the outside of the housing 500 through a space formed inside the connection member 662.

The gas supply unit 700 supplies a gas to the treating space 501. The gas supply unit 700 may include a gas supply nozzle 710, a gas supply line 720, and a gas supply source 730.

The gas supply nozzle 710 is installed on a ceiling wall of the housing 500. For example, the gas supply nozzle 710 may be installed in a central area of the ceiling wall among an entire region of the ceiling wall of the housing 500. An injection port (not shown) is formed on a bottom surface of the gas supply nozzle 710. The injection port (not shown) injects the gas into the housing 500.

An end of the gas supply line 720 is connected to the gas supply nozzle 710 and the other end thereof is connected to the gas supply source 730. The gas supply source 730 may store the gas. The gas according to an embodiment may be a gas which is excited in a plasma state by a plasma source to be described later. However, the inventive concept is not limited thereto, and the gas may be a gas which contributes to being excited in a plasma state. In addition, the gas may be a precursor gas. A gas valve 740 is installed in the gas supply line 720. The gas valve 740 may be an opening/closing valve. In addition, the gas valve 740 may further include a flow control valve.

The plasma source excites the gas supplied into the housing 500 into the plasma state. The plasma source according to an embodiment may be capacitively coupled plasma (CCP). Hereinafter, a case in which the capacitively-coupled plasma (CCP) is used as a plasma source according to an embodiment will be described as an example.

The plasma source may include a top electrode and a bottom electrode. The top electrode and the bottom electrode are disposed to face each other inside the housing 500. Any one of both electrodes may apply a high-frequency power, and the other electrode may be grounded. Selectively, the high frequency power may be applied to both electrodes. An electronic field is formed in a space between both electrodes, and the gas supplied to the space may be excited in a plasma state. A generated plasma acts on the substrate W to plasma-treat the substrate W. According to an embodiment, the top electrode may be an electrode plate 830 to be described later, and the bottom electrode may be the base plate 630 described above.

The shower head unit 800 is positioned above the support unit 600 inside the housing 500. The shower head unit 800 may include a shower plate 810, an electrode plate 830, and a support part 850.

The shower plate 810 is disposed above the support unit 600 to face the support unit 600. The shower plate 810 is positioned to be spaced apart from the ceiling wall of the housing 500 by a predetermined distance in a downward direction. According to an embodiment, the shower plate 810 may have a disk shape having a constant thickness. The shower plate 810 may be an insulator.

In addition, a plurality of through holes 812 are formed in the shower plate 810. The through-hole 812 penetrates the top surface and the bottom surface of the shower plate 810. The through hole 812 is formed at a position opposite to the hole 832 formed in the electrode plate 830 to be described later.

The electrode plate 830 is disposed above the shower plate 810. The electrode plate 830 is disposed to be spaced apart from the ceiling wall of the housing 500 by a predetermined distance in the downward direction. Accordingly, a space is formed between the electrode plate 830 and the ceiling wall of the housing 500. According to an embodiment, the electrode plate 830 has a shape corresponding to that of the shower plate 810. For example, the electrode plate 830 may have a disk shape having a constant thickness.

A material of the electrode plate 830 may include a metal. The electrode plate 830 may be grounded. However, as described above, the electrode plate 830 may be electrically connected to the high frequency power source to function as a plasma source. The bottom surface of the electrode plate 830 may be polarized to minimize an arc phenomenon caused by the plasma.

A plurality of holes 832 are formed in the electrode plate 830. The hole 832 penetrates the top surface and the bottom surface of the electrode plate 830 in the vertical direction. Each of the plurality of holes 832 may be formed at positions corresponding to the plurality of through holes 812 formed in the shower plate 810. Accordingly, the plurality of holes 832 and a plurality of through holes 812 may be in fluid communication with each other.

The gas sprayed from the gas supply nozzle 710 flows into a space formed by combining the electrode plate 830 and the housing 500. The gas is supplied from the space to the treating space 501 through the hole 832 and the through hole 812. The gas supplied to the treating space 501 is exposed and excited by an electric field formed in the treating space 501 by the top electrode (e.g., an electrode plate 830) and the bottom electrode (e.g., a base plate 630). Accordingly, the plasma is generated in the treating space 501.

The support part 850 supports a side portion of the shower plate 810 and a side portion of the electrode plate 830, respectively. More specifically, a top end of the support part 850 is connected to the ceiling wall of the housing 500, and a bottom portion of the support part 850 is connected to a side of the shower plate 810 and a side of the electrode plate 830, respectively. A material of the support part 850 may include a non-metal.

Hereinafter, a modified embodiment of the inventive concept will be described. The embodiments described below are mostly the same as or similar to the above-described embodiments except for an additional description, and thus descriptions thereof will be omitted for overlapping contents.

Figure 8:
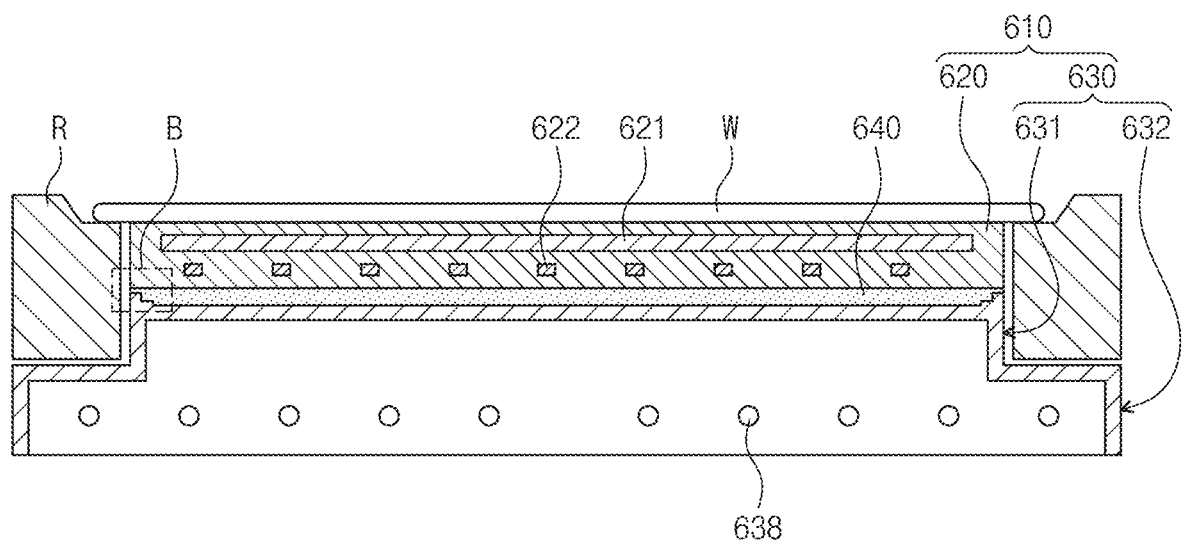
FIG. 8 is an enlarged cross-sectional view illustrating only a support plate, a base plate, and a ring member among a support unit according to another embodiment.
Figure 9:
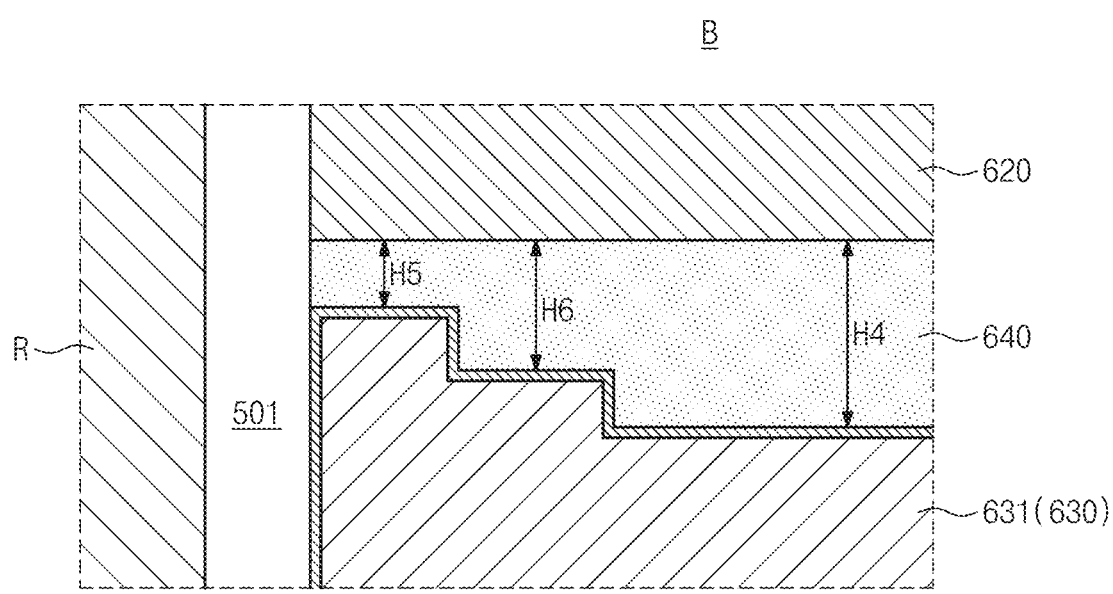
FIG. 9 is an enlarged cross-sectional view of part B of FIG. 8.

FIG. 8 is an enlarged cross-sectional view illustrating only a support plate, a base plate, and a ring member among a support unit according to another embodiment. FIG. 9 is an enlarged cross-sectional view of part B of FIG. 8.

Referring to FIG. 8 and FIG. 9, the top surface of the base plate 630 may have different heights for each region thereof. For example, the top surface of the base plate 630 may be formed to be stepped so that an edge region thereof is higher than a central region. Specifically, the edge region of the base plate 630 may be positioned higher from the ground than the central region of the base plate 630. More specifically, from the central region of the base plate 630 to the edge region, a step may be formed so that a height of the top surface of the base plate 630 increases. For example, the adhesive layer 640 formed in the central region of the base plate 630 may have a fourth height H4. In addition, the adhesive layer 640 formed in a region relatively far from the central region of the base plate 630 among the edge region of the base plate 630 may have a fifth height H5. In addition, the adhesive layer 640 formed in a region relatively adjacent to the central region of the base plate 630 among the edge region of the base plate 630 may have a sixth height H6. In this case, the fourth height H4 may be higher than the sixth height H6, and the sixth height H6 may be higher than the fifth height H5.

Although FIG. 9 illustrates that the top surface of the base plate 630 is stepped in three stages, the inventive concept is not limited thereto. For example, the top surface of the base plate 630 may be formed to be stepped in two stages. In addition, the top surface of the base plate 630 may be formed to be stepped in four or more stages.

According to an embodiment of the inventive concept, an exposed area of the adhesive layer 640 exposed to the treating space 501 may be minimized, and the height of the adhesive layer 640 capable of smoothly adhering the support plate 620 and the base plate 630 to each other may be ensured.

Figure 10:
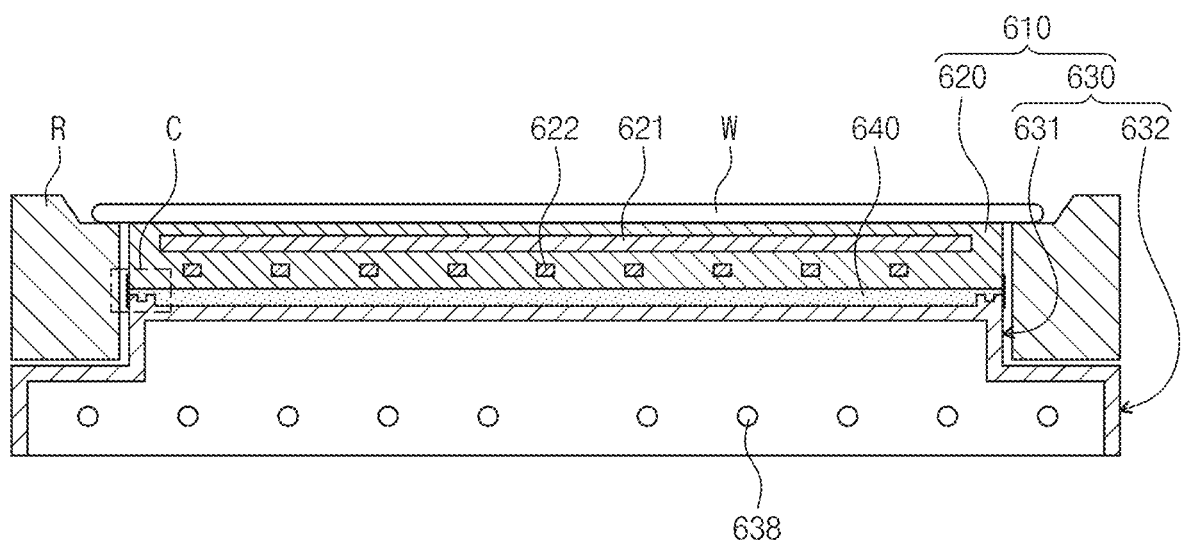
FIG. 10 is an enlarged cross-sectional view illustrating only the support plate, the base plate, and the ring member among the support unit according to another embodiment.
Figure 11:
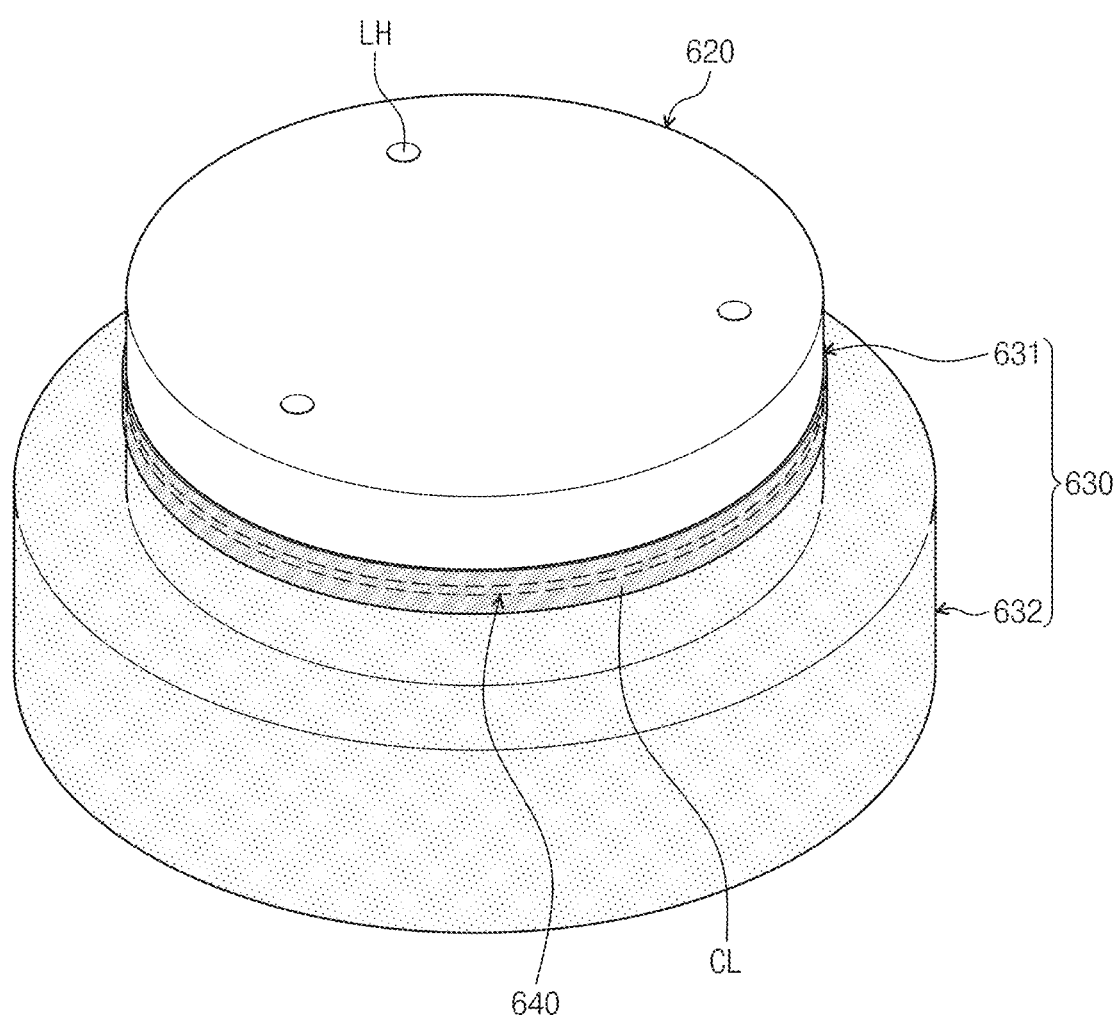
FIG. 11 is a perspective view schematically showing the support plate and the base plate according to an embodiment of FIG. 10.
Figure 12:
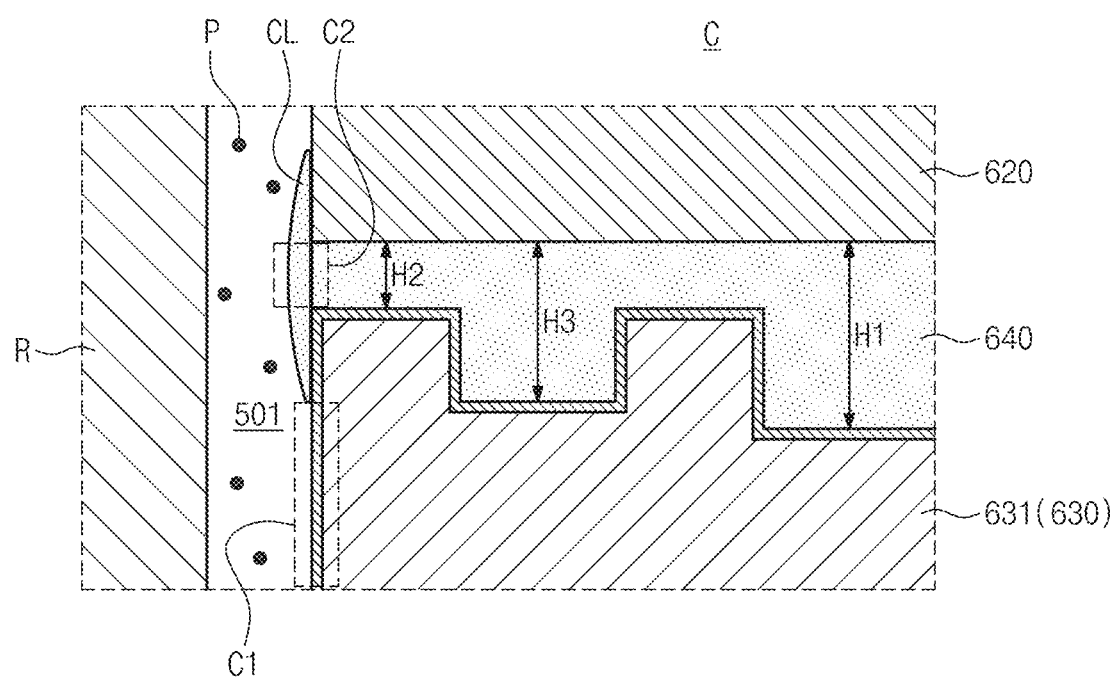
FIG. 12 is an enlarged cross-sectional view of part C of FIG. 10.

FIG. 10 is an enlarged cross-sectional view illustrating only a support plate, a base plate, and a ring member among a support unit according to another embodiment. FIG. 11 is a perspective view schematically showing a support plate and a base plate according to an embodiment of FIG. 10. FIG. 12 is an enlarged cross-sectional view of part C of FIG. 10.

Referring to FIG. 10 to FIG. 12, the pin hole LH described above is formed up to the top surface of the support plate 620. Among the surfaces of the adhesive layer 640, a surface exposed to the treating space 501 may be coated. For example, an outer surface of the adhesive layer 640 may be coated. In addition, the outer surface of the adhesive layer 640 is coated with a material having a stronger corrosion resistance than the adhesive layer 640. More specifically, the outer surface of the adhesive layer 640 may be coated with a material having a stronger plasma resistance than the adhesive layer 640. According to an embodiment, the outer surface of the adhesive layer 640 may be coated with a material including an $Al_2O_3$. A coating layer CL coated on the outer surface of the adhesive layer 640 may be formed along a circumferential direction of the adhesive layer 640. The coating layer CL is sufficient as long as the outer surface of the adhesive layer 640 is not exposed to the treating space 501. For example, it is sufficient if the coating layer CL is formed to cover the outer surface of the adhesive layer 640.

According to an embodiment, after the groove 635 is formed in the edge region of the base plate 630, the surface of the base plate 630 is coated with the $Al_2O_3$ using an atmospheric pressure plasma coating method. Subsequently, an adhesive is filled between the support plate 620 and the base plate 630 to form the adhesive layer 640 between the bottom surface of the support plate 620 and the top surface of the base plate 630. Subsequently, the outer surface of the adhesive layer 640 is coated with a material containing the $Al_2O_3$ along the circumferential direction of the adhesive layer 640. In this case, the outer surface of the adhesive layer 640 may be coated using an atomic layer deposition method, a chemical vapor deposition method, or a physical vapor deposition method. Among them, since the physical vapor deposition method may cause a deformation of the outer surface of the adhesive layer 640, the outer surface of the adhesive layer 640 may be preferably coated using the atomic layer deposition method or the chemical vapor deposition method. If the outer surface of the adhesive layer 640 is coated using the atomic layer deposition method, an atom may be uniformly deposited on the outer surface of the adhesive layer 640.

As described above, a side surface (see part C1 of FIG. 12) of the base plate 630 among the surface of the base plate 630 may be exposed to the treating space 501 and etched by the plasma P. However, according to an embodiment of the inventive concept, a surface which may be exposed to the treating space 501 among the surface of the base plate 630 is coated with a material with a strong plasma resistance, thereby primarily blocking the cause of damage to the base plate 630 by the plasma P generated in the treating space 501.

In addition, the outer surface of the adhesive layer 640 (see part C2 of FIG. 12) may be directly exposed to the treating space 501 and etched by the plasma P, as described above. Accordingly, according to an embodiment of the inventive concept, due to a structure of the groove 635, the adhesive force of the support plate 620 and the base plate 630 is supplemented in the edge region, and the area of the adhesive layer 640 exposed to the treating space 501 is minimized to prevent a damage to the adhesive layer 640.

In addition, by coating the outer surface of the adhesive layer 640 exposed to the treating space 501 with a material containing the $Al_2O_3$, the outer surface of the adhesive layer 640 can be secondarily prevented from being damaged by the plasma P generated in the treating space 501.

Figure 13:
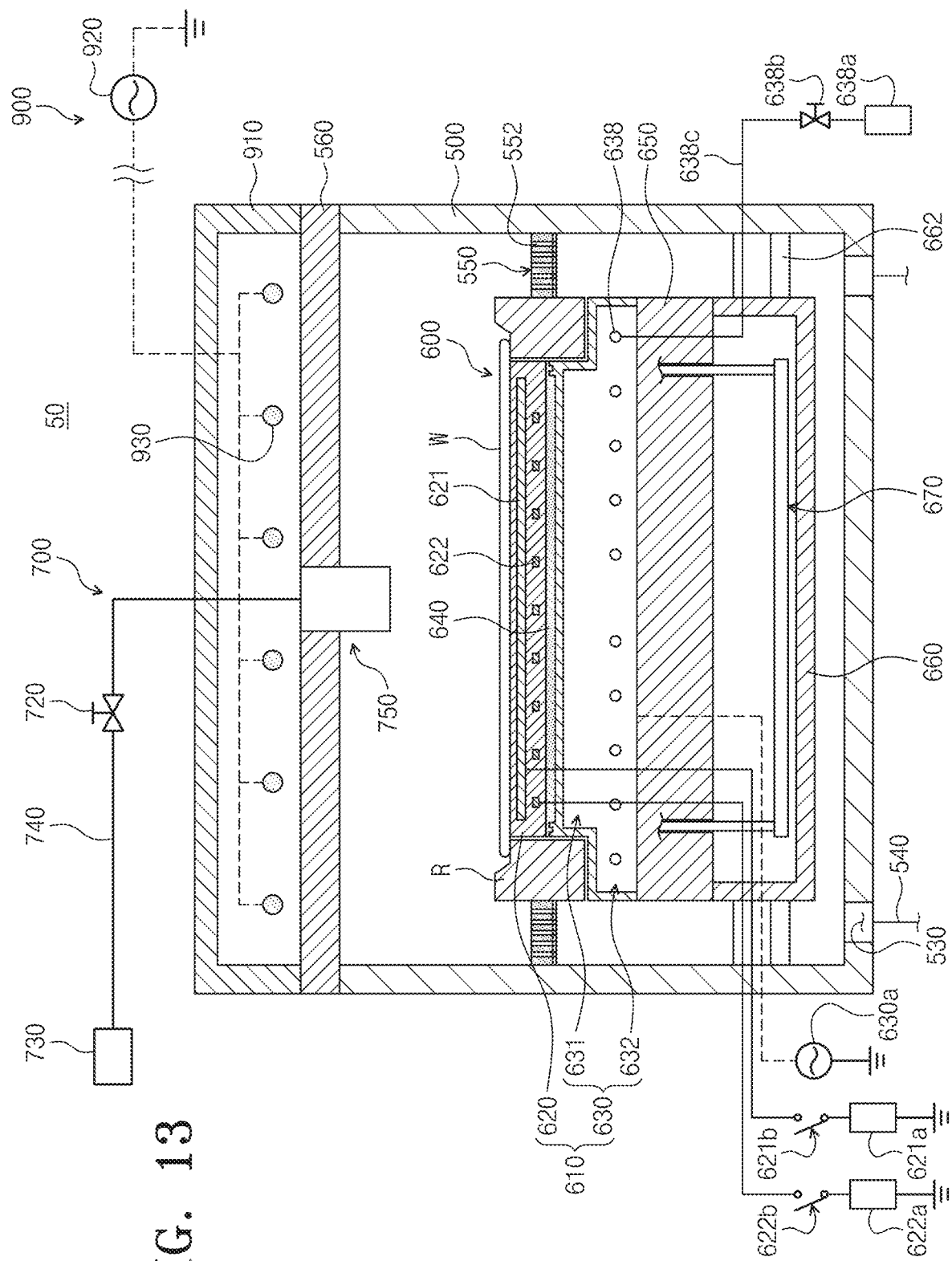
FIG. 13 is a cross-sectional view schematically illustrating the process chamber according to another embodiment.

FIG. 13 is a schematically illustrates a process chamber according to another embodiment. Referring to FIG. 13, the process chamber 50 according to an embodiment of the inventive concept may include a housing 500, a support unit 600, a gas supply unit 700, and a plasma source 900. Since the support unit 600 according to an embodiment has mostly the same or similar structure as the above-described embodiment, a description of the overlapping content will be omitted.

The housing 500 may have a shape in which a top surface thereof is open. For example, the housing 500 may have a cylindrical shape with an open top surface. The open top surface of the housing 500 may be sealed by the cover 560. The cover 560 is positioned above the housing 500. The cover 560 may have a plate shape covering the open top surface of the housing 500. The housing 500 and the cover 560 are combined with each other to define a treating space 501 at a bottom portion. The cover 560 includes a dielectric substance window. A groove may be formed in a central portion including a center of the cover 560. The groove formed in the central portion of the cover 560 may penetrate the top surface and the bottom surface of the cover 560.

The gas supply unit 700 may include a gas supply line 720, a gas supply source 730, a gas valve 740, and a nozzle unit 750. Since the gas supply line 720, the gas supply source 730, and the gas valve 740 have most of the same or similar structures as those of the above-described embodiments, descriptions thereof will be omitted.

The nozzle unit 750 is connected to an end of the gas supply line 720. The nozzle unit 750 is inserted into the groove formed in the central portion of the cover 560. A plurality of injection holes (not shown) are formed in a bottom portion of the nozzle unit 750. The nozzle unit 750 injects a gas supplied from the gas supply line 720 into the treating space 501.

The plasma source 900 excites the gas supplied to the treating space 501 into a plasma state. An inductively coupled plasma (ICP) may be used as the plasma source 900 according to an embodiment. However, the inventive concept is not limited thereto, and the plasma source 900 may be changed into various structures capable of generating the plasma other than a microwave plasma.

The plasma source 900 may include an antenna housing 910, a plasma power source 920, and an antenna 930. The antenna housing 910 may have a cylindrical shape with an open bottom. In addition, the antenna housing 910 may have a diameter corresponding to that of the housing 500. The antenna housing 910 may be disposed above the housing 500 and the cover 560. An antenna 930 to be described later is disposed in an inner space of the antenna housing 910.

The plasma power source 920 may be positioned outside the process chamber 50. The plasma power source 920 may apply a high frequency power to the antenna 930 to be described later. In addition, an end of the power line to which the plasma power source 920 is connected may be grounded. In addition, an impedance matcher may be installed on the power line.

The antenna 930 may be formed of a coil having a spiral shape which wound around a plurality of circuits. The coil is disposed at a position opposite to the substrate W. More specifically, the coil is disposed at a position overlapping the substrate W supported by the support unit 600 when viewed from above. The coil is connected to the plasma power source 920 to be applied with the high frequency power from the plasma power source 920. According to an embodiment, the coil may receive the high-frequency power from the plasma power source 920 and the treating space 501 may induce a time-variant electric field. Accordingly, the gas supplied to the treating space 501 may be excited in a plasma state.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a housing having a treating space for treating a substrate;
a support unit in the treating space; and
a plasma source configured to generate a plasma by exciting a gas supplied to the treating space, and
the support unit including
a first plate configured to support the substrate on a top side,
a second plate at a bottom side of the first plate, and
an adhesive layer configured to adhere the first plate and the second plate to each other, and
wherein a top surface of the second plate is divided into
a central region including a center of the top surface and an edge region surrounding the central region, and
a height of the adhesive layer between a bottom surface of the first plate and the top surface of the second plate is substantially different at the central region and at the edge region, and
a height of the top surface of the second plate at the edge region is different than a height of the top surface of the second plate at the central region.

2. The substrate treating apparatus of claim 1, wherein the top surface of the second plate is stepped so the edge region is higher than the central region.

3. The substrate treating apparatus of claim 1, wherein the edge region has a groove which is downwardly recessed from the top surface of the second plate.

4. The substrate treating apparatus of claim 3, wherein the first plate and the second plate each have a circular form when seen from above, and
the groove is in a ring shape along a circumference of the edge region.

5. The substrate treating apparatus of claim 4, wherein the adhesive layer has a first height at the central region, and a second height, the second height being lower than the first height at a region not including the groove among the edge region, and
a region including the groove is has a lower or a same height as the first height and further includes a third height which is higher than the second height.

6. The substrate treating apparatus of claim 1, wherein a surface of the second plate is coated with a material having a stronger plasma resistance than the adhesive layer.

7. The substrate treating apparatus of claim 6, wherein an outer surface of the adhesive layer is exposed to the treating space, and
the outer surface of the adhesive layer is coated with a material having a stronger plasma resistance than the adhesive layer.

8. The substrate treating apparatus of claim 7, wherein the surface of the second plate and the outer surface of the adhesive layer are each coated with a material including an $Al_2O_3$.

9. The substrate treating apparatus of claim 8, wherein the surface of the second plate is coated using an atmospheric plasma spraying method.

10. The substrate treating apparatus of claim 8, wherein the outer surface of the adhesive layer is coated using an atomic layer deposition method or a chemical vapor deposition method.

11. The substrate treating apparatus of claim 4, wherein a diameter of a top portion of the second plate is smaller than a diameter of a bottom portion of the second plate.

12. The substrate treating apparatus of claim 1, further comprising:
- a gas supply unit configured to supply the gas;
- a shower plate at a top side of the support unit including a plurality of through-holes configured to flow the gas supplied by the gas supply unit to the treating space; and
- an electrode plate at the top side of the support unit configured to be applied with a high frequency power or configured to be grounded, and
- wherein the support unit further comprises:
  - a third plate at a bottom side of the second plate, and
  - a cover at bottom side of the third plate including a lift pin assembly therein configured to lift and lower the substrate at a top side of the first plate.

13. A support unit comprising:
- a support plate configured to support a substrate at a top side thereon;
- a base plate at a bottom side of the support plate; and
- an adhesive layer between the support plate and the base plate, the adhesive layer configured to adhere the support plate and the base plate to each other, and
- wherein a top surface of the base plate is divided into a central region including a center of the top surface and an edge region surrounding the central region,
- a height of the adhesive layer is substantially different at the central region and at the edge region, and
- a height of the top surface of the base plate at the edge region is different than a height of the top surface of the base plate at the central region.

14. The support unit of claim 13, wherein a surface of the base plate is coated in a material having a stronger plasma resistance than the adhesive layer.

15. The support unit of claim 13, wherein an outer surface of the adhesive layer is coated with a material having a stronger plasma resistance than the adhesive layer.

16. The support unit of claim 14, wherein a height of the top surface of the base plate is higher at the edge region than at the central region.

17. The support unit of claim 16, wherein the support plate and the base plate have a circular form, and
- at least one groove is downwardly recessed from the top surface of the base plate, and
- the groove is in a ring shape along a circumference of the edge region.

18. The support unit of claim 17, wherein the adhesive layer has a first height at the central region, and a second height which is lower than the first height at a region not including the groove among the edge region, and
- a region including the groove has a lower or a same height as the first height and further includes a third height which is higher than the second height.

19. A substrate treating apparatus comprising:
- a housing having a treating space therein;
- a support unit in the treating space and configured to support a substrate;
- a gas supply unit configured to supply a gas to the treating space; and
- an electrode plate at a top side of the support unit configured to be applied with a high frequency power configured to be grounded, and
- the support unit including
  - a support plate having a circular shape and configured to support the substrate on a top side,
  - a base plate having a circular shape and at a bottom side of the support plate, and configured to be applied with a high frequency power or configured to be grounded; and
- an adhesive layer between the support plate and the base plate configured to adhere the support plate and the base plate, and
- wherein a top surface of the base plate is divided into a central region including a center of the top surface and an edge region surrounding the central region, and
- the top surface of the base plate is stepped so the edge region is higher than the central region, and
- a groove which is downwardly recessed from the top surface of the base plate is in a ring shape along a circumference of the edge region at the edge region.

20. The substrate treating apparatus of claim 19, wherein an outer surface of the adhesive layer and a surface of the base plate is coated in a material including an $Al_2O_3$ which has a stronger plasma resistance than the adhesive layer.

* * * * *